(12) United States Patent
Zhu et al.

(10) Patent No.: US 8,344,433 B2
(45) Date of Patent: Jan. 1, 2013

(54) MAGNETIC TUNNEL JUNCTION (MTJ) AND METHODS, AND MAGNETIC RANDOM ACCESS MEMORY (MRAM) EMPLOYING SAME

(75) Inventors: Xiaochun Zhu, San Diego, CA (US); Matthew Nowak, San Diego, CA (US); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 28 days.

(21) Appl. No.: 12/423,298

(22) Filed: Apr. 14, 2009

(65) Prior Publication Data
US 2010/0258887 A1    Oct. 14, 2010

(51) Int. Cl.
*H01L 29/82*    (2006.01)
*H01L 21/00*    (2006.01)
(52) U.S. Cl. ............. 257/295; 257/421; 257/E29.323; 257/E21.001; 438/3
(58) Field of Classification Search .......... 257/295; 365/158
See application file for complete search history.

(56) References Cited

U.S. PATENT DOCUMENTS

| 2004/0125648 A1* | 7/2004 | Iwata ............................. 365/158 |
| 2005/0099724 A1* | 5/2005 | Nakamura et al. ............ 360/125 |
| 2005/0276099 A1 | 12/2005 | Horng |
| 2006/0141640 A1 | 6/2006 | Huai |
| 2006/0146602 A1* | 7/2006 | Lin et al. ........................ 365/171 |
| 2007/0002503 A1* | 1/2007 | Sbiaa et al. ............... 360/324.11 |
| 2007/0063236 A1 | 3/2007 | Huai |
| 2008/0088980 A1* | 4/2008 | Kitagawa et al. ............. 360/313 |
| 2008/0180859 A1 | 7/2008 | Ueda |
| 2009/0161422 A1* | 6/2009 | Zhu et al. ....................... 365/171 |

OTHER PUBLICATIONS

International Search Report-PCT/ US2010/031080, International Search Authority—European Patent Office Nov. 26, 2010.
Written Opinion—PCT/ US2010/031080, International Search Authority—European Patent Office Nov. 26, 2010.

* cited by examiner

*Primary Examiner* — Jarrett Stark
*Assistant Examiner* — Lawrence Tynes, Jr.
(74) *Attorney, Agent, or Firm* — Sam Talpalatsky; Nicholas J. Pauley; Jonathan T. Velasco

(57) ABSTRACT

Magnetic tunnel junctions (MTJs) and methods of forming same are disclosed. A pinned layer is disposed in the MTJ such that a free layer of the MTJ can couple to a drain of an access transistor when provided in a magnetic random access memory (MRAM) bitcell. This structure alters the write current flow direction to align the write current characteristics of the MTJ with write current supply capability of an MRAM bitcell employing the MTJ. As a result, more write current can be provided to switch the MTJ from a parallel (P) to anti-parallel (AP) state. An anti-ferromagnetic material (AFM) layer is provided on the pinned layer to fix pinned layer magnetization. To provide enough area for depositing the AFM layer to secure pinned layer magnetization, a pinned layer having a pinned layer surface area greater than a free layer surface area of the free layer is provided.

25 Claims, 11 Drawing Sheets

MAGNETIC TUNNEL JUNCTION (MTJ) AND METHODS, AND MAGNETIC RANDOM ACCESS MEMORY (MRAM) EMPLOYING SAME

BACKGROUND

I. Field of the Disclosure

The technology of the present application relates generally to magnetic tunnel junctions (MTJ), related methods, and use of a MTJ in magnetic random access memory (MRAM).

II. Background

Magnetic random access memory (MRAM) is non-volatile memory in which data is stored by programming a magnetic tunnel junction (MTJ). MRAM is advantageous, because a MTJ can be used to store information even when power is turned off. Data is stored in the MTJ as a small magnetic element rather than an electric charge or current. An exemplary MTJ 10 is illustrated in FIG. 1. Data is stored in the MTJ 10 according to the magnetic orientation between two layers: a free layer 12 disposed above a fixed or pinned layer 14. The free and pinned layers 12, 14 are formed from a ferromagnetic material. The MTJ 10 is configured in a conventional "bottom-spin valve" configuration wherein the pinned layer 14 is disposed below the free layer 12. The free and pinned layers 12, 14 are separated by a tunnel junction or barrier 16 formed by a thin non-magnetic dielectric layer. The free and pinned layers 12, 14 can store information even when the magnetic H-field is '0' due to the hysteresis loop 18 of the MTJ 10. Electrons can tunnel through the tunnel barrier 16 if a bias voltage is applied between two electrodes 20, 22 coupled on ends of the MTJ 10. The tunneling current depends on the relative orientation of the free and pinned layers 12, 14. When using a spin-torque-transfer (STT) MTJ, the difference in the tunneling current as the spin alignment of the free and pinned layers is switched between P and AP is known as the tunnel magnetoresistance ratio (TMR).

When the magnetic orientation of the free and pinned layers 12, 14 are anti-parallel (AP) to each other (shown in FIG. 1 as MTJ 10'), a first memory state exists (e.g., a logical '1'). When the magnetic orientation of the free and pinned layers 12, 14 are parallel (P) to each other (shown in FIG. 1 as MTJ 10"), a second memory state exists (e.g., a logical '0'). The magnetic orientation of the free and pinned layers 12, 14 can be sensed to read data stored in the MTJ 10 by sensing the resistance when current flows through the MTJ 10. Data can also be written and stored in the MTJ 10 by applying a magnetic field to change the orientation of a free ferromagnetic layer 12 to either a P or AP magnetic orientation with respect to the pinned layer 14. The magnetic orientation of the free layer 12 can be changed, but the magnetic orientation of the pinned layer 14 is fixed.

FIG. 2 illustrates a STT MTJ 23 (referred to as "MTJ 23") of similar design to the MTJ 10 in FIG. 1. The MTJ 23 is provided as part of a MRAM bitcell 24 to store non-volatile data. The MRAM bitcell 24 may be provided in a memory array and used as memory storage for any type of system requiring electronic memory, such as a computer processing unit (CPU) or processor-based system, as examples. A metal-oxide semiconductor (typically n-type MOS, i.e., NMOS) access transistor 26 is provided to control reading and writing to the MTJ 23. The drain (D) of the access transistor 26 is coupled to the bottom electrode 22 of the MTJ 23, coupled to the pinned layer 14. A write line ($V_{WL}$) is coupled to the gate (G) of the access transistor 26. The source (S) of the access transistor 26 is coupled to a voltage source ($V_S$). A bit line ($V_{BL}$) is coupled to the top electrode 20 of the MTJ 23, which is coupled to the free layer 12.

When reading data stored in the MTJ 23, the bit line ($V_{BL}$) is activated for the access transistor 26 to allow current to flow through the MTJ 23 between the electrodes 20, 22. A low resistance, as measured by voltage applied on the bit line ($V_{BL}$) divided by the measured current, is associated with a P orientation between the free and pinned layers 12, 14. A higher resistance is associated with an AP orientation between the free and pinned layers 12, 14. When writing data to the MTJ 23, the gate (G) of the access transistor 26 is activated by activating the write line ($V_{WL}$). A voltage differential between the bit line ($V_{BL}$) and the source line ($V_S$) is applied. As a result, a write current (I) is generated between the drain (D) and the source (S). If the magnetic orientation is to be changed from AP to P, a write current ($I_{AP-P}$) flowing from the top electrode 20 to the bottom electrode 22 is generated, which induces a spin transfer torque (STT) at the free layer 12 to change the magnetic orientation of the free layer 12 to P with respect to the pinned layer 14. If the magnetic orientation is to be changed from P to AP, a current ($I_{P-AP}$) flowing from the bottom electrode 22 to the top electrode 20 is produced, which induces an STT at the free layer 12 to change the magnetic orientation of the free layer 12 to AP with respect to the pinned layer 14.

As illustrated in FIG. 2, more write current (I) can be supplied by the circuitry to switch the MTJ 23 in the MRAM bitcell 24 from an AP to P state ($I_{AP-P}$) than from a P to AP state ($I_{P-AP}$). This is due to the source loading of the access transistor 26 in the MRAM bitcell 24. The source loading of the access transistor 26 has the effect of providing more write current (I) to switch the MTJ 23 from an AP to P state than from a P to AP state. However, the inherent magnetic characteristics of MTJ 23 require the opposite. That is, when the MTJ 23 is employed in the MRAM bitcell 24, as illustrated in FIG. 2, more write current (I) is required to switch the MTJ 23 from a P to AP state than from an AP to P state. This is shown by the graph 30 in FIG. 3, which illustrates the inherent magnetic characteristics of the MTJ 23 as a function of write current ($I_C$). As shown therein, the amount of write current (I) required to switch the MTJ 23 from a P to AP state ($I_{C\ P-AP}$) is much greater than the amount of write current (I) required to switch the MTJ 23 from an AP to P state ($I_{C\ AP-P}$). This presents a design conflict. On the one hand, the inherent magnetic characteristics of the MTJ 23 requires more write current (I) to switch the MTJ 23 from a P to AP state than from an AP to P state. However, when the MTJ 23 is employed in the MRAM bitcell 24, more write current (I) can be supplied by the circuitry to switch the MTJ 23 from an AP to P state than from a P to AP state.

In summary, as a result of this design conflict, the inherent write current characteristics of the MTJ 23 are not aligned to the write supply current capability of the MTJ 23 when employed in the MRAM bitcell 24. More write current is required to switch the MTJ 23 from a P to AP state when employed in the MRAM bitcell 24. However, the MRAM bitcell 24 can provide more write current to switch the MTJ 23 from an AP to P state. Thus, a need exists to provide a MTJ design that solves this design conflict. More efficient switching of memory states in circuits and/or applications employing MRAM may be realized as a result.

SUMMARY OF THE DISCLOSURE

Embodiments disclosed in the detailed description include a magnetic tunnel junction (MTJ) and methods of forming same. An MTJ may be employed in a magnetic random access memory (MRAM) bitcell to provide magnetic storage of data. The MRAM bitcell is comprised of a MTJ and an access transistor. The MTJ is comprised of an MTJ layer structure providing tunnel barrier between a first electrode and a second electrode. A free layer is disposed between the first electrode and the tunnel barrier. A reference or pinned layer is disposed between the first electrode and the tunnel barrier. Providing this MRAM bitcell structure couples the drain of the access transistor with the free layer of the MTJ. As a result, more write current can be supplied or provided by the MRAM bitcell write circuitry to switch the MTJ from a parallel (P) to an anti-parallel (AP) state. This is opposed to conventional MTJ designs that dispose the free layer above the pinned layer with the drain of the access transistor coupled to the pinned layer, where the MRAM bitcell can supply less write current to switch the MTJ from a P to AP state. By disposing the pinned layer in the MTJ such that the drain of the access transistor is coupled to the free layer as provided herein, the inherent write current characteristics of the MTJ are aligned to the write supply current capability of the MTJ when employed in an MRAM bitcell. More write current will be required to switch the MTJ from a P to AP state than from an AP to P state in both cases. As a result, more current, may be supplied to switch the MTJ from a P to AP state in the MRAM bitcell over conventional MTJ designs employed in an MRAM bitcell.

Even when disposing the pinned layer and the free layer in a MTJ design such that the drain of the access transistor is coupled to the free layer, the magnetization of the pinned layer is fixed in a given direction. If the magnetization of the pinned layer is lost, the MTJ cannot be used to retain or store information. In this regard, an anti-ferromagnetic material (AFM) may be employed to provide an AFM layer. The AFM layer pins or fixes the magnetization of the pinned layer in a given direction. The AFM layer is coupled directly or indirectly to the pinned layer, which is typically not a textured layer. Thus, the AFM layer may not grow as well and may not strongly pin the edges of the pinned layer. This is opposed to a conventional MTJ structure where an AFM layer is deposited at the bottom on a textured layer beneath the pinned layer. In this regard, MTJ embodiments disclosed herein provide a pinned layer having a pinned layer surface area greater than a free layer surface area of the free layer. This allows a greater surface area for the AFM layer to be coupled to the pinned layer. Thus, even if the edges of the pinned layer are not strongly pinned by the AFM layer, a sufficient internal area of the pinned layer can be pinned well by the AFM layer to retain magnetization and function as a sufficient reference layer for a given free layer size in a MTJ. If a pinned layer were not provided having a pinned layer surface area greater than a free layer surface area of the free layer, the surface area of the pinned layer strongly pinned by the AFM layer may not be large enough for the pinned layer to retain magnetization and/or provide a sufficient reference layer for the MTJ to function properly.

BRIEF DESCRIPTION OF THE FIGURES

FIG. 5a is a diagram of an exemplary cross-section of a portion of the MTJ that may be employed in the MRAM bitcell of FIG. 4a;

FIG. 6a is a diagram of an exemplary cross-section of a portion of a MTJ having a pinned layer disposed above and having a length greater than the length of a free layer, and that may be employed in the MRAM bitcell of FIG. 4a;

DETAILED DESCRIPTION

Figure 1:
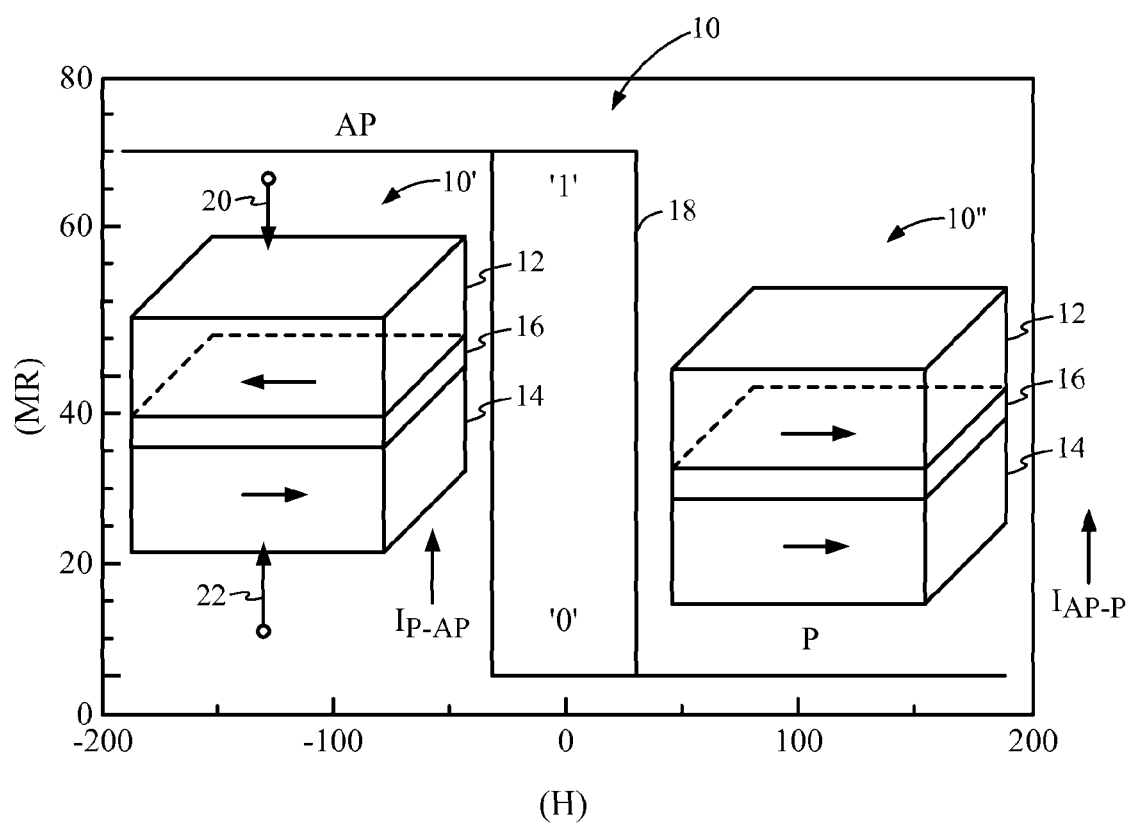
FIG. 1 is an illustration of a magnetic tunnel junction (MTJ) in the prior art shown in both parallel (P) and anti-parallel (AP) states.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include a magnetic tunnel junction (MTJ) and methods of forming same. An MTJ may be employed in a magnetic random access memory (MRAM) bitcell to provide magnetic storage of data. The MRAM bitcell is comprised of an MTJ and an access transistor. The MTJ is comprised of a MTJ layer structure providing tunnel barrier between a first electrode and a second electrode. A free layer is disposed between the second electrode and the tunnel barrier. A reference or pinned layer is disposed between the first electrode and the tunnel barrier. Providing this MRAM bitcell structure couples the drain of the access transistor with the free layer of the MTJ. As a result, more write current can by supplied or provided by the MRAM bitcell write circuitry to switch the MTJ from a parallel (P) to an anti-parallel (AP) state. This is opposed to conventional MTJ designs that dispose the free layer above the pinned layer with the drain of the access transistor coupled to the pinned layer, where the MRAM bitcell can supply less write current to switch the MTJ from a P to AP state. By disposing the pinned layer in the MTJ such that the drain of the access transistor is coupled to the free layer as provided herein, the inherent write current characteristics of the MTJ are aligned to the write supply current capability of the MTJ when employed in an MRAM bitcell. More write current will be required to switch the MTJ from a P to AP state than from an AP to P state in both cases. As a result, more current, may be supplied to switch the MTJ from a P to AP state in the MRAM bitcell over conventional MTJ designs employed in an MRAM bitcell.

Figure 4A:
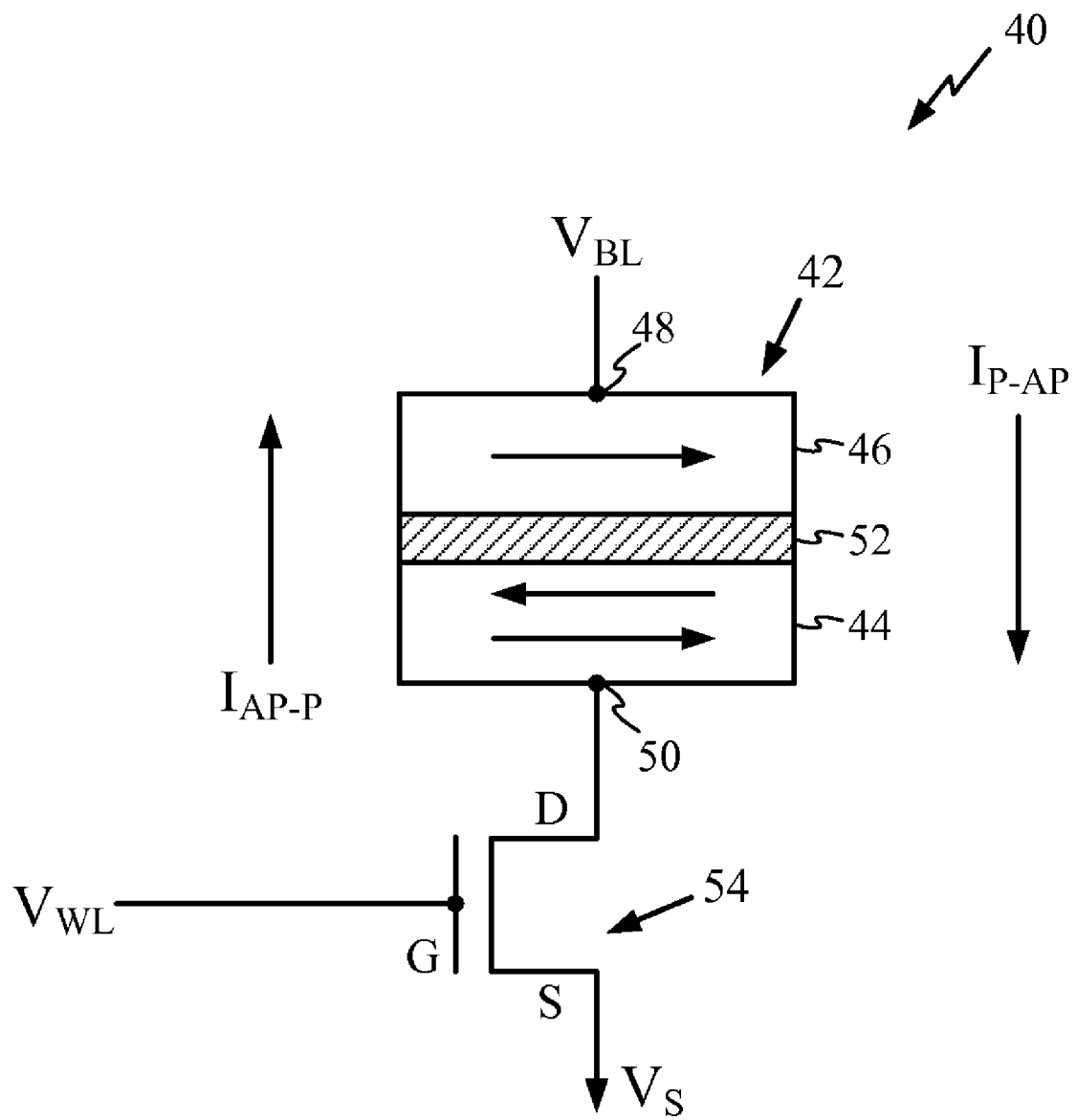
FIG. 4a is a diagram of an exemplary MRAM bitcell employing an exemplary MTJ design providing a pinned layer disposed above a free layer.
Figure 4B:
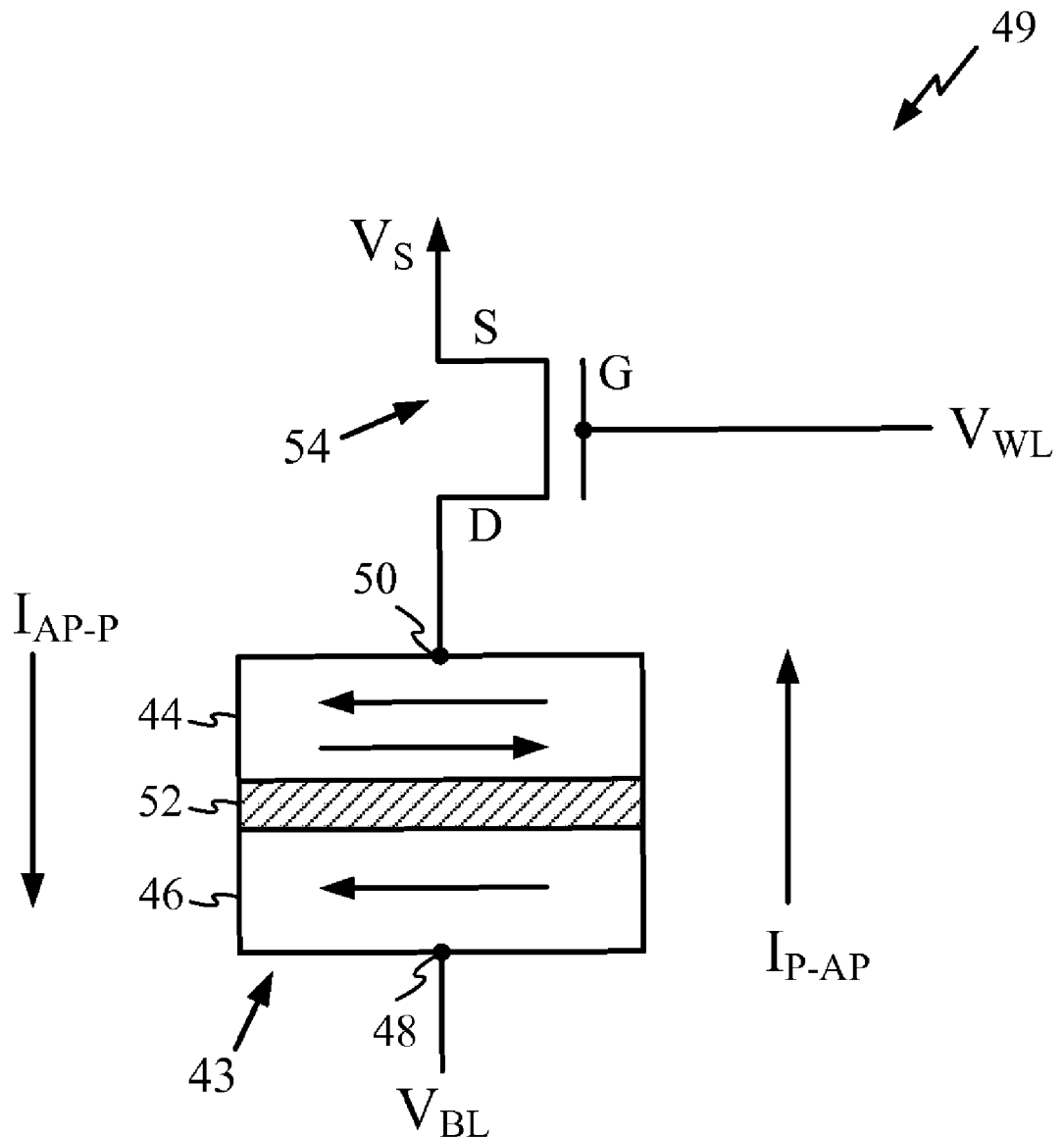
FIG. 4b is a diagram of an exemplary MRAM bitcell employing an exemplary MTJ design providing a free layer disposed above a pinned layer.

In this regard, FIG. 4a illustrates an exemplary MRAM bitcell 40 containing an exemplary MTJ 42. To store data in the MTJ 42, the orientation of the MTJ 42 is such that the drain of an access transistor is coupled to the free layer 44 of the MTJ 42, as opposed to the pinned layer 46. The MTJ 42 in FIG. 4a is configured to provide the pinned layer 46 disposed above the free ferromagnetic layer 44. This is opposed to a conventional MTJ design where the free layer is disposed above the pinned layer, such as in the MTJ 23 illustrated in FIG. 2. This switched orientation addresses the above-referenced design conflict between the write current characteristics of an MTJ and a write current supply capability of an MRAM bitcell employing the MTJ. A person of ordinary skill in the art will understand that the pinned layer 46 may also be disposed below the free ferromagnetic layer 44. FIG. 4b shows such an exemplary embodiment.

FIG. 4b illustrates an exemplary MRAM bitcell 49 containing exemplary MTJ 43. The MTJ 43 in FIG. 4b is configured to provide the free ferromagnetic layer 44 disposed above the pinned layer 46. The pinned layer 46 is coupled to the first electrode 48. The free layer 44 is coupled to the second electrode 50. A bit line ($V_{BL}$) is coupled to the first electrode 48. The drain (D) of an access transistor 54 is coupled to the second electrode 50. This switched orientation of the free layer 44 with respect to the drain of the access transistor 54 addresses the above referenced design conflict between the write current characteristics of an MTJ and a write current supply capability of an MRAM bitcell employing the MTJ. For discussion purposes, FIG. 4a will be referred to, but a person of ordinary skill in the art will understand that the exemplary MRAM bitcell 49 may be used.

Figure 2:
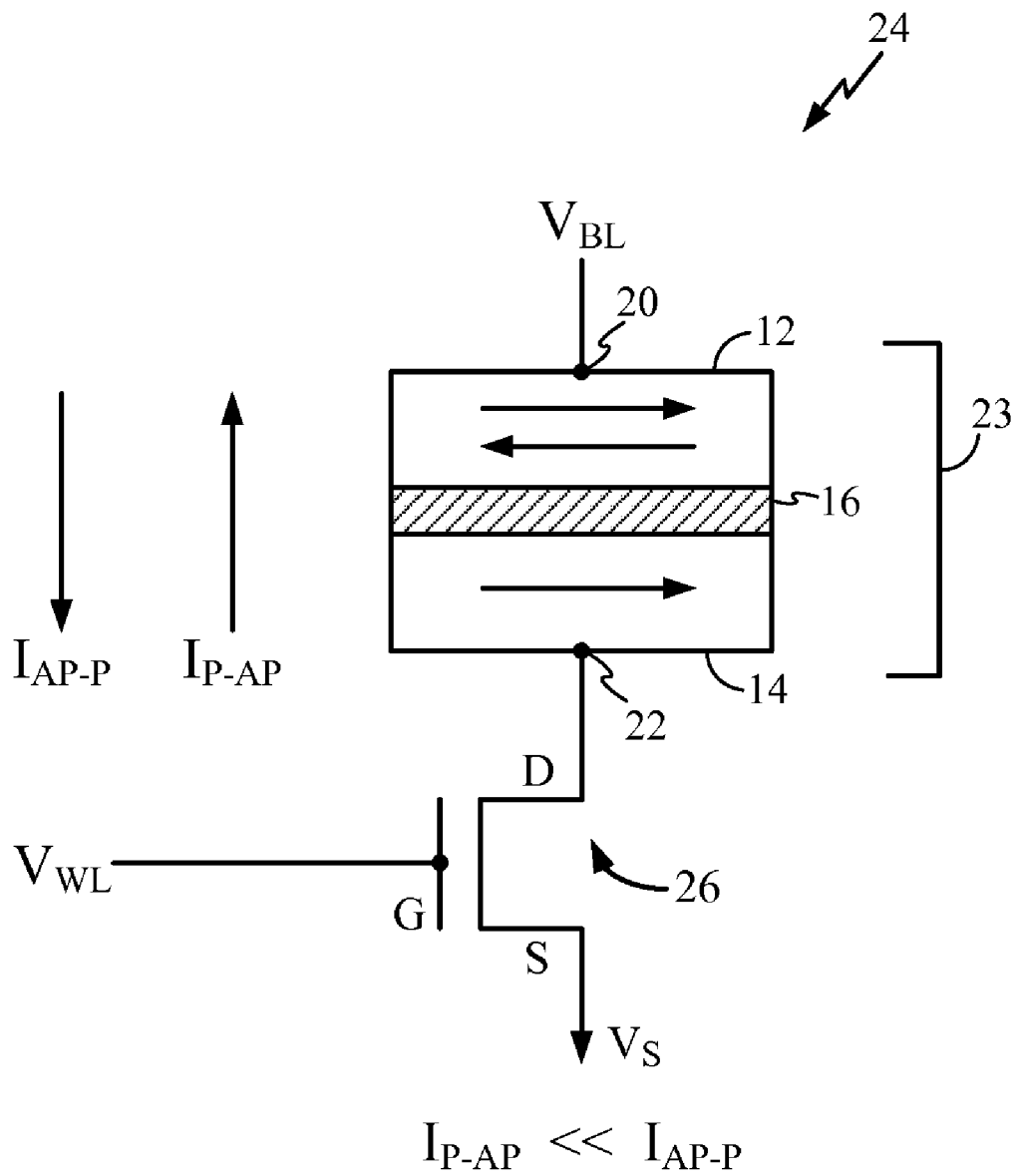
FIG. 2 is a diagram of an exemplary MRAM bitcell employing a conventional MTJ design in the prior art.
Figure 3:
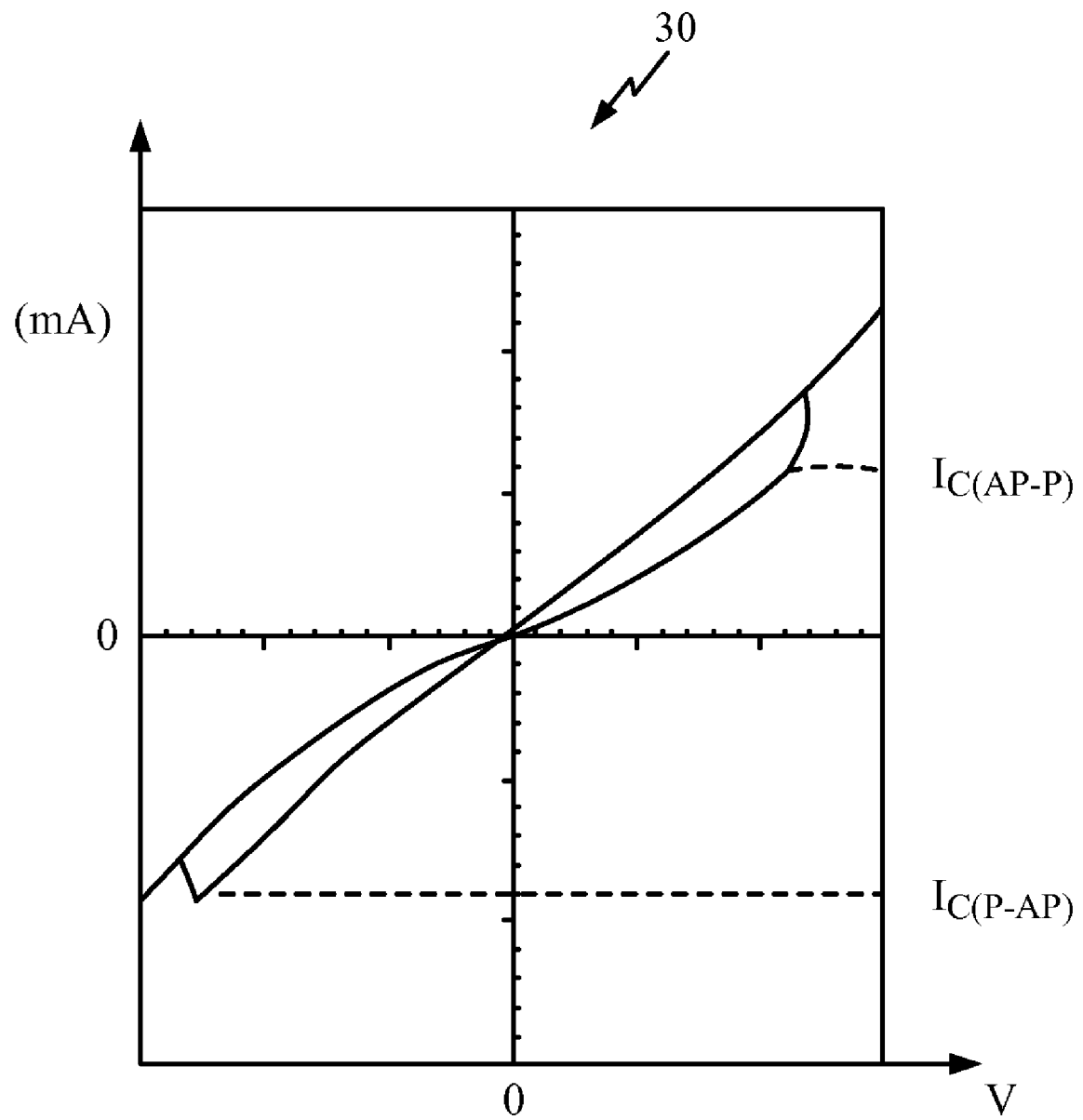
FIG. 3 is an exemplary graph illustrating the write current to switch the state of the MTJ of FIG. 2 from both P to AP and AP to P.

In FIG. 4a, disposing the free layer 44 beneath the pinned layer 46 in this arrangement allows the drain of an access transistor to be coupled to the free layer 44 of the MTJ 42, as opposed to a pinned layer as in the MRAM bitcell 24 illustrated in FIG. 2. As a result, more write current can be provided to switch the MTJ 42 from a P to AP state than from an AP to P state. Thus, when the MTJ 42 is employed in the MRAM bitcell 40, the inherent write current characteristics of the MTJ 42 are compatible or aligned with the write current supply capability of the MTJ 42 when employed in the MRAM bitcell 40. This compatibility or alignment means that the inherent write current characteristics of the MTJ 42 require more current to switch the MTJ 42 from a P to AP state than from an AP to P state, while the write current supply capability of the MTJ 42 when employed in the MRAM bitcell 40 can also provide more current to switch the MTJ 42 from a P to AP state than from an AP to P state.

As illustrated in the exemplary MRAM bitcell 40 of FIG. 4a, the pinned layer 46 is coupled to the first electrode 48. The free layer 44 is coupled to the second electrode 50. A bit line ($V_{BL}$) is coupled to the first electrode 48. The drain (D) of an access transistor 54 is coupled to the second electrode 50. The access transistor 44 is shown as an NMOS transistor; however, any type of transistor may be employed as desired. A write line ($V_{WL}$) is coupled to the gate (G) of the access transistor 54. The source (S) of the access transistor 54 is coupled to a voltage source ($V_S$). The bit line ($V_{BL}$) is coupled to the first electrode 48 of the MTJ 42. When reading the data stored in the MTJ 42, the write line ($V_{WL}$) is activated to activate the access transistor 54 to allow current to flow through the MTJ 42 between the first and second electrodes 48, 50. A low resistance, as measured by voltage applied on the bit line ($V_{BL}$) divided by the measured current, is associated with a P orientation between the free and pinned layers 44, 46. A higher resistance is associated with an AP orientation between the free and pinned layers 44, 46.

When writing data to the MTJ 42, the existing magnetic orientation of the free layer 44 and pinned layer 46 is first determined. If the magnetic orientation is required to be changed to store new data in the MTJ 42, the gate (G) of the access transistor 54 is activated by applying a voltage on the write line ($V_{WL}$). A write current is generated between the drain (D) and the source (S). If the magnetic orientation of the MTJ 42 is to be changed from a P to AP state, a current ($I_{P-AP}$) is produced flowing from the first electrode 48 to the second electrode 50 to induce a spin transfer torque (STT) at the free layer 44 to change the magnetic orientation of the free layer 44 to AP with respect to the pinned layer 46. If the magnetic orientation of the MTJ 42 is to be changed from an AP to P state, a current ($I_{AP-P}$) is produced flowing from the second electrode 50 to the first electrode 48 to induce a STT at the free layer 44 to change the magnetic orientation of the free layer 44 to P with respect to the pinned layer 46.

Figure 5A:
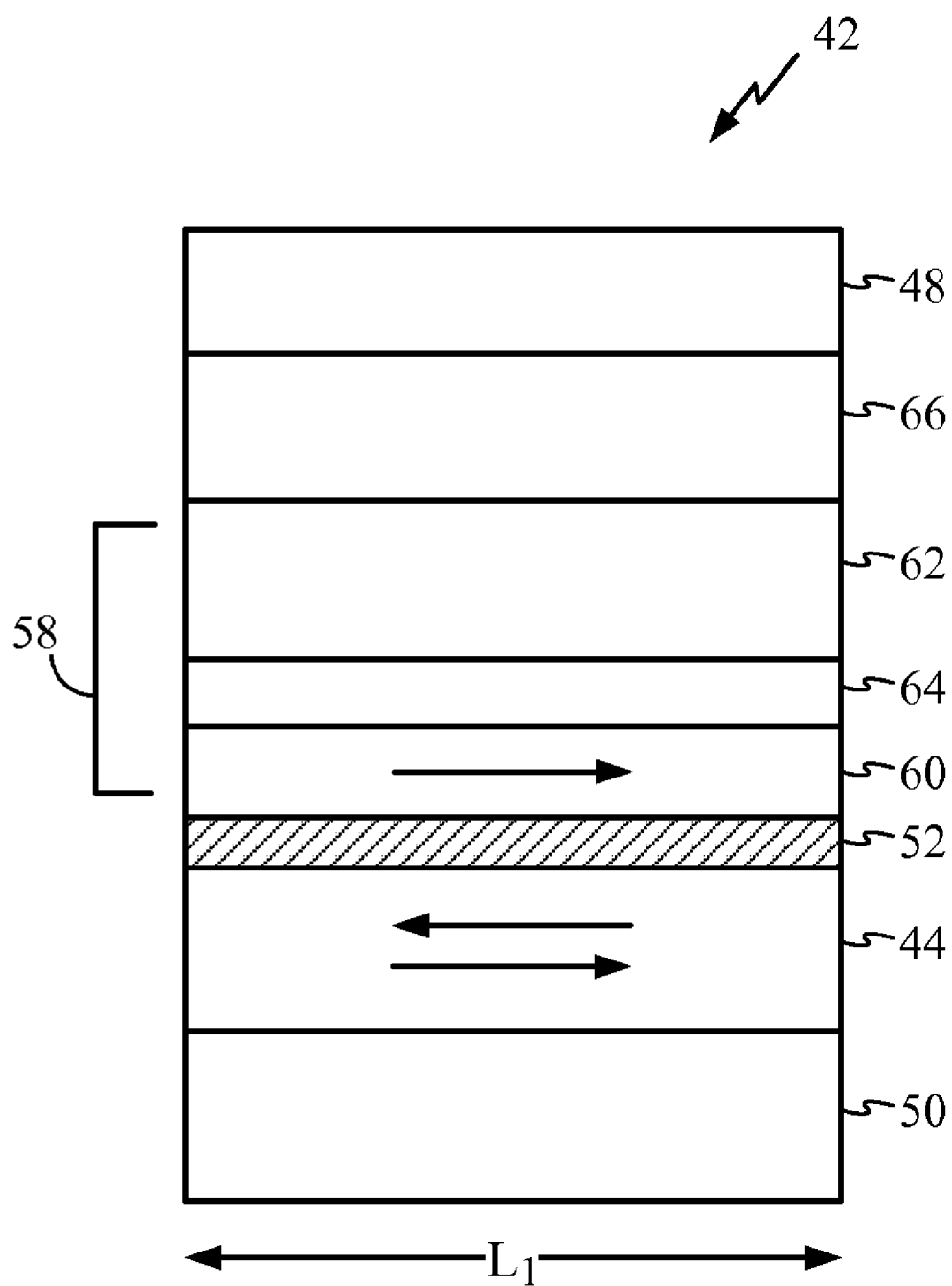

FIG. 5a illustrates an exemplary cross-section of the MTJ 42 employed in the MRAM bitcell 40 of FIG. 4a. The layers in the MTJ 42 each have an approximately same length shown as "$L_1$", which may be between 1.0 nanometer (nm) and 1.0 micrometer (µm) as an example. Therein, the pinned layer 60 is disposed above the free layer 44 to change the switching current flow direction in the MRAM bitcell 40 of FIG. 4a. The pinned layer 60 may be provided as part of a synthetic anti-ferromagnetic (SAF) pinned layer structure 58. This is discussed further below. The MTJ 42 is formed by depositing a stack of layers on the second electrode 50. The layers in the MTJ 42 may be formed by sputtering or ion beam deposition. In this embodiment, the free layer 44 is first placed or deposited on top of the second electrode 50. The free layer 44 has a magnetic moment that is either P or AP to the magnetic moment of the pinned layer 60 or 58. The magnetic moment of the free layer 44 may change in response to external magnetic fields, and it is the relative orientation of the magnetic moments between the free and pinned layers 44, 60 or 58 that determines the tunneling current and therefore the resistance of the tunnel barrier 52. The free layer 44 may be formed of suitable thickness, which may be between approximately 1 nm and 1 µm as an example. The free layer 44 may be formed from any suitable ferromagnetic material desired. Examples include Cobalt(Co)-Iron(Fe)-Boron(B) (CoFeB), CoFe, and Nickel(Ni)-Iron (NiFe). The free layer 44 may also be comprised of composite ferromagnetic layers.

A thin dielectric material is next placed or deposited on the free layer 44 to form the tunnel barrier 52 followed by the pinned layer 60 or 58. The tunnel barrier 52 may be formed of suitable thickness, which may be between approximately 1 and 20 Angstroms as an example. The tunnel barrier 52 may be formed from any suitable dielectric material desired. Examples include Magnesium Oxide (MgO), Aluminum Oxides ($AlO_x$), and Titanium Oxides ($TiO_x$). The pinned layer 60 may be provided as part of a synthetic anti-ferromagnetic (SAF) pinned layer structure 58 comprised of two ferromagnetic layers 60, 62 separated by a coupling layer 64. The coupling layer 64 may be formed from a base material that is non-magnetic or substantially non-magnetic to form a non-magnetic spacing layer, an example of which includes Ruthenium (Ru). The ferromagnetic layers 60, 62 may be comprised of alloys that include iron. The pinned layer 60 may also be comprised of a single pinned ferromagnetic layer. The pinned layer 60 may be formed from any suitable ferromagnetic material and may be of any suitable thickness, which may be between approximately 1 and 100 Angstroms as an example.

An anti-ferromagnetic material (AFM) layer 66 is coupled directly or indirectly to the pinned layer 60 in a fixed direction. The AFM layer 66 may be placed or deposited on top of the pinned layer 60 to hold or "pin" the magnetic moment of the pinned layer 60 in a fixed direction. The AFM layer 66 pins the magnetization of the SAF pinned layer structure 58. The pinned layer 60 or 58 is pinned in a given direction by exchange coupling with the adjacent AFM layer 66 magnetized in the given direction. The AFM layer 66 may be formed of suitable thickness, which may be between approximately 10 and 10000 Angstroms as an example. The AFM layer 66 may be formed from any suitable anti-ferromagnetic material desired. Examples include Platinum-Manganese (PtMn), and Iridium-Manganese (IrMn).

Figure 5B:
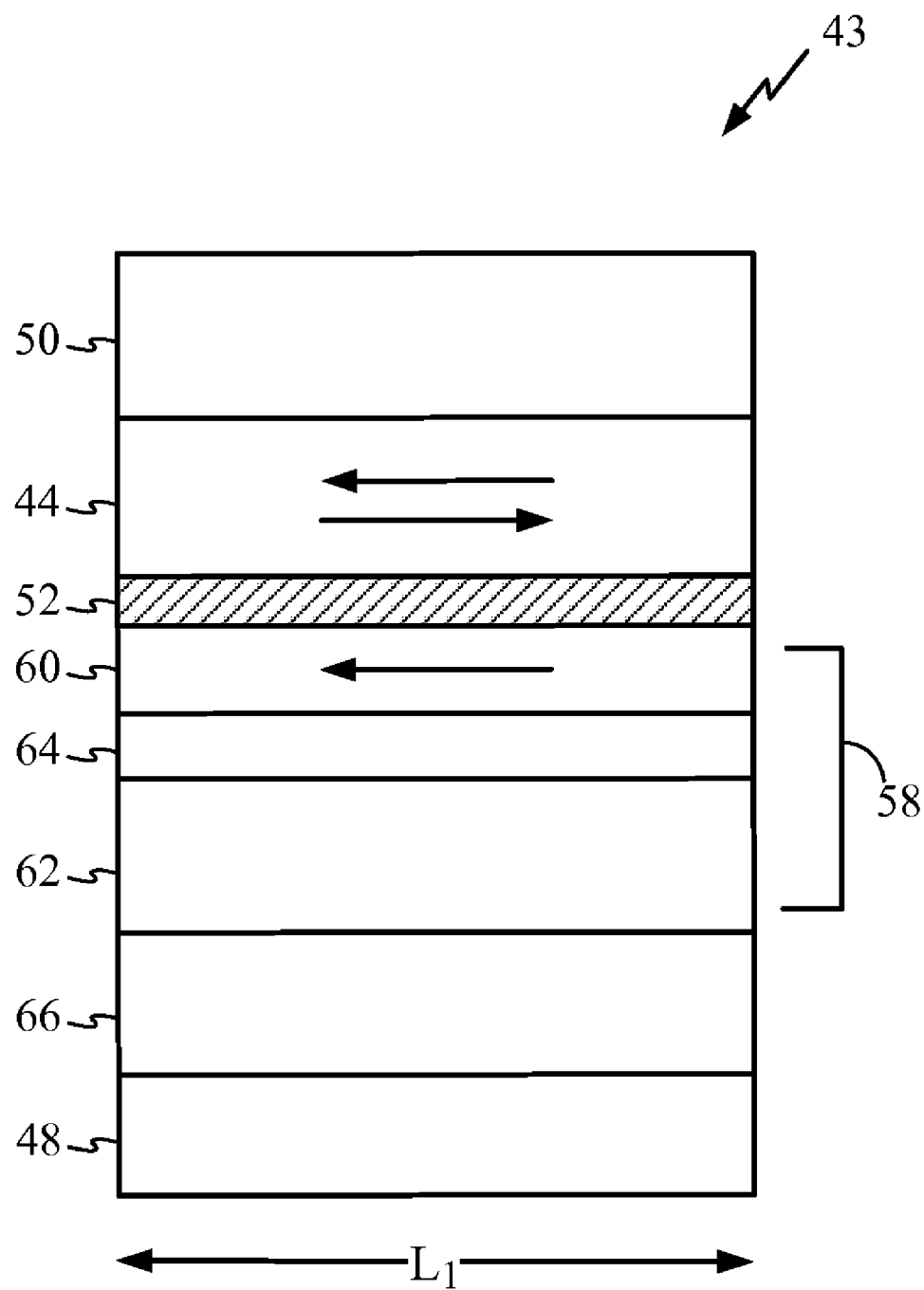
FIG. 5b is a diagram of an exemplary cross-section of a portion of the MTJ that may be employed in the MRAM bitcell of FIG. 4b.

FIG. 5b illustrates an exemplary cross-section of the MTJ 43 employed in the MRAM bitcell 49 of FIG. 4b. The layers in the MTJ 42 each have an approximately same length shown as "$L_1$", which may be between 1.0 nanometer (nm) and 1.0 micrometer (μm) as an example. Therein, the pinned layer 60 is disposed below the free layer 44 to change the switching current flow direction in the MRAM bitcell 49 of FIG. 4b. The MTJ 43 is formed by depositing a stack of layers on the first electrode 48. The layers in the MTJ 43 may be formed by sputtering or ion beam deposition.

In FIG. 5b, an anti-ferromagnetic material (AFM) layer 66 is coupled to the first electrode 48 by being placed or deposited on top of the first electrode 48 to hold or "pin" the magnetic moment of the pinned layer 60 in a fixed direction. Coupling may be direct or indirect. The AFM layer 66 may be formed of suitable thickness, which may be between approximately 10 and 10000 Angstroms as an example. The AFM layer 66 may be formed from any suitable anti-ferromagnetic material desired. Examples include Platinum-Manganese (PtMn), and Iridium-Manganese (IrMn). The pinned layer 60 may be placed or deposited on top of the AFM 66 as part of a synthetic anti-ferromagnetic (SAF) pinned layer structure 58. The AFM layer 66 pins the magnetization of the SAF pinned layer structure 58. A thin dielectric material is next placed or deposited on the pinned layer 60 to form the tunnel barrier 52 followed by the free layer 44. The tunnel barrier 52 may be formed of suitable thickness, which may be between approximately 1 and 20 Angstroms as an example. The tunnel barrier 52 may be formed from any suitable dielectric material desired. Examples include Magnesium Oxide (MgO), Aluminum Oxides ($AlO_x$), and Titanium Oxides ($TiO_x$). The ferromagnetic layers 60, 62 may be comprised of alloys that include iron. The pinned layer 60 may also be comprised of a single pinned ferromagnetic layer. The pinned layer 60 may be formed from any suitable ferromagnetic material and may be of any suitable thickness, which may be between approximately 1 and 100 Angstroms as an example.

In this embodiment, the free layer 44 is placed or deposited above the tunnel barrier 52 and below the second electrode 50. The free layer 44 has a magnetic moment that is either P or AP to the magnetic moment of the pinned layer 60 or 58. The magnetic moment of the free layer 44 may change in response to external magnetic fields, and it is the relative orientation of the magnetic moments between the free and pinned layers 44, 60 or 58 that determines the tunneling current and therefore the resistance of the tunnel barrier 52. The free layer 44 may be formed of suitable thickness, which may be between approximately 1 nm and 1 μm as an example. The free layer 44 may be formed from any suitable ferromagnetic material desired. Examples include Cobalt(Co)-Iron (Fe)-Boron(B) (CoFeB), CoFe, and Nickel(Ni)-Iron (NiFe). The free layer 44 may also be comprised of composite ferromagnetic layers.

As previously discussed in the exemplary embodiments illustrated in FIGS. 4a and 4b, the free layer 44 is coupled to the drain of the drain of the access transistor 54. This changes the switching current flow direction in the MRAM bitcells 40 and 49 of FIGS. 4a and 4b. Therefore, the MRAM bitcell 40 and 49 can supply more write current to switch the MTJ 42 and 43 respectively from a P to AP state, which also requires more write current. However, in FIG. 4a the AFM layer 66 may not pin the magnetization of the SAF pinned layer structure 58 well such that the SAF pinned layer structure 58 could lose its magnetization, particularly at the MTJ edges. This is because the AFM layer 66 is placed or deposited on top of the SAF pinned layer structure 58, which is typically not a textured layer. Thus, the AFM layer 66 cannot be grown as well as can be achieved in a conventional MTJ structure, where an AFM layer is deposited at the bottom on a textured seed layer beneath the pinned layer due to the pinned layer being disposed below the free layer. Thus, in the MTJ 42 of FIG. 5a for example, the AFM layer 66 may not strongly pin the edges of the SAF pinned layer structure 58. If the SAF pinned layer structure 58 is not strongly pinned, this can result in loss of operation margin and even loss of magnetization and corruption of data stored in the MTJ 42 as a result.

Figure 6A:
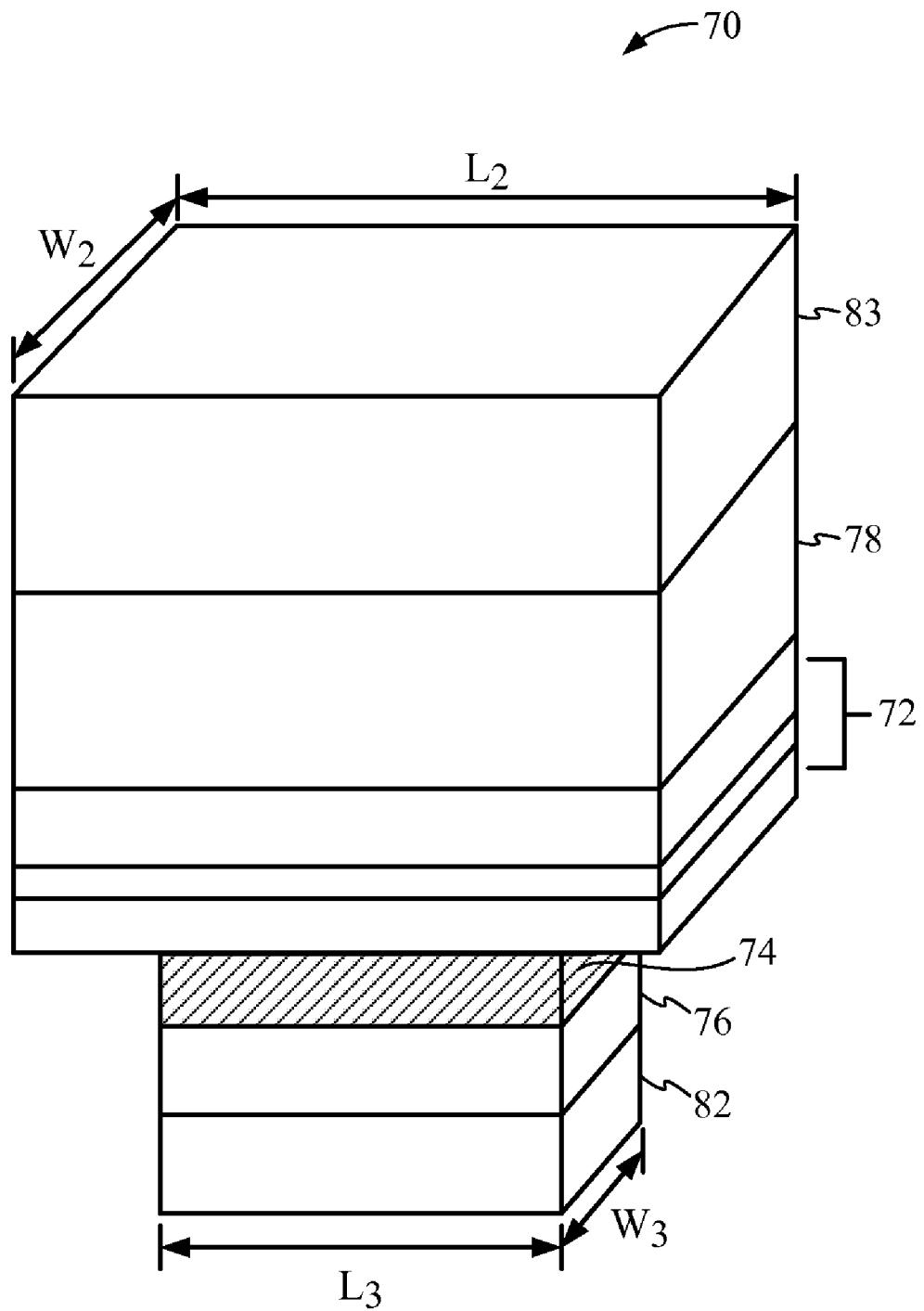

To address this issue, FIG. 6a illustrates an alternate exemplary embodiment of an MTJ design and method of forming the same. A MTJ 70 is provided as part of a semiconductor die, as shown. In order to fix or pin the magnetization of a pinned layer 72 in a fixed direction, an anti-ferromagnetic material (AFM) is employed to provide an AFM layer 78 similar to the MTJ 42 of FIG. 5a. However, the MTJ 70 provides a pinned layer 72 having a pinned layer surface area greater than a free layer surface area of a free layer 76. In this embodiment, as an example, the pinned layer 72 has a pinned layer length greater than the length of the free layer 76 such that the surface area of a cross-section of the pinned layer 72 is greater than the surface area of a cross-section of the free layer 76. By providing the pinned layer 72 having a pinned layer surface area greater than a free layer surface area of the free layer 76, this allows a greater surface area for the AFM layer 78 to be placed, deposited, or grown up on top of the pinned layer 72. Thus, even if the edges of the pinned layer 72 are not strongly pinned by the AFM layer 78, a sufficient internal area of the pinned layer 72 can be pinned well by the AFM layer 78 to retain magnetization and/or function sufficient as a reference layer for a given free layer 76 size in the MTJ 70. If the pinned layer 72 did not have a pinned layer surface area greater than a free layer surface area of the free layer 76, the surface area of the pinned layer 72 strongly pinned by the AFM layer 78 may not be large enough to retain its magnetization or to provide a sufficient reference layer for the MTJ 70.

A pinned layer surface area being greater than a free layer surface area is not limited to any particular geometry or physical design. For example, the length and/or width dimensions of a pinned layer may be greater than the length and/or width dimensions of a free layer to provide a pinned layer having a greater surface area than the free layer. As another example, if the structures of the cross-sections of the pinned layer and/or the free layer are circular or elliptical, these dimensions can include diameter or radius, circumference, or both. Ellipses have two radius dimensions, and either or both can be greater in a pinned layer than in a free layer. If the structures of the cross-sections of the pinned layer and/or free layer are polygons, the dimensions can include length of sides, angle between sides, height, and/or width, or any combination of same. Further, if the structures of the cross-sections of the pinned layer and/or free layer are different, the dimensions can be provided in any manner as long as the surface area of the pinned layer is greater than the surface area of the free layer. An example of such would be if the cross-section of the pinned layer were elliptical and the cross-section of the free layer were a polygon, or vice versa. Corresponding dimensions could include diameter to length, radius to length, diameter to width, and radius to width, as examples.

As illustrated in the MTJ 70 of FIG. 6a, the cross-sections of the pinned layer 72 and free layer 76 are rectangular. The pinned layer 72 is provided having a first length (hereinafter the "pinned layer length") shown as "$L_2$". The free layer 76 is provided having a second length (hereinafter the "free layer length") shown as "$L_3$". The pinned layer length $L_2$ is greater than the length of the free layer length $L_3$. This provides for the surface area of the pinned layer 72 to be greater than the surface area of the free layer 76 in this embodiment. The pinned layer length can be of any length desired. For example, the pinned layer length may be at least ten percent (10%) longer than the free layer length. One exemplary embodiment provides the pinned layer length to be between approximately one hundred ten percent (110%) and three hundred percent (300%) greater than the free layer length.

Variations can be provided. For example, in the MTJ 70 of FIG. 6a, the lengths and/or width of a second electrode 82 and/or tunnel barrier 74 may be placed or deposited in the MTJ 70 at the same or substantially the same length and/or width as the free layer, or they may be placed or deposited in the MTJ 70 at different lengths and/or widths. Also as an example, the length of a first electrode 83 placed above the AFM layer 78 may be of the same, longer, or shorter length and/or width than the length and/or width of the AFM layer 78, the pinned layer 72, or the free layer 76 as long as the pinned layer 72 has a pinned layer surface area greater than a free layer surface area of the free layer 76. For example, the width of the pinned layer 72 (hereinafter the "pinned layer width"), shown as "$W_2$" in FIG. 6a, may be greater than the width of the free layer 76 (hereinafter the "free layer width"), shown as "$W_3$" in FIG. 6a. As an example, pinned layer width $W_2$ may be 120 nm, and free layer width $W_3$ may be 100 nm. Alternatively, the pinned layer width and the free layer width may be the same or substantially the same. The pinned layer width may also be less than the free layer, although most designs would either provide a pinned layer having a pinned layer width that is the same or substantially the same as free layer width, or a pinned layer width greater than a free layer width due to constraints of placement or depositing techniques.

Figure 6B:
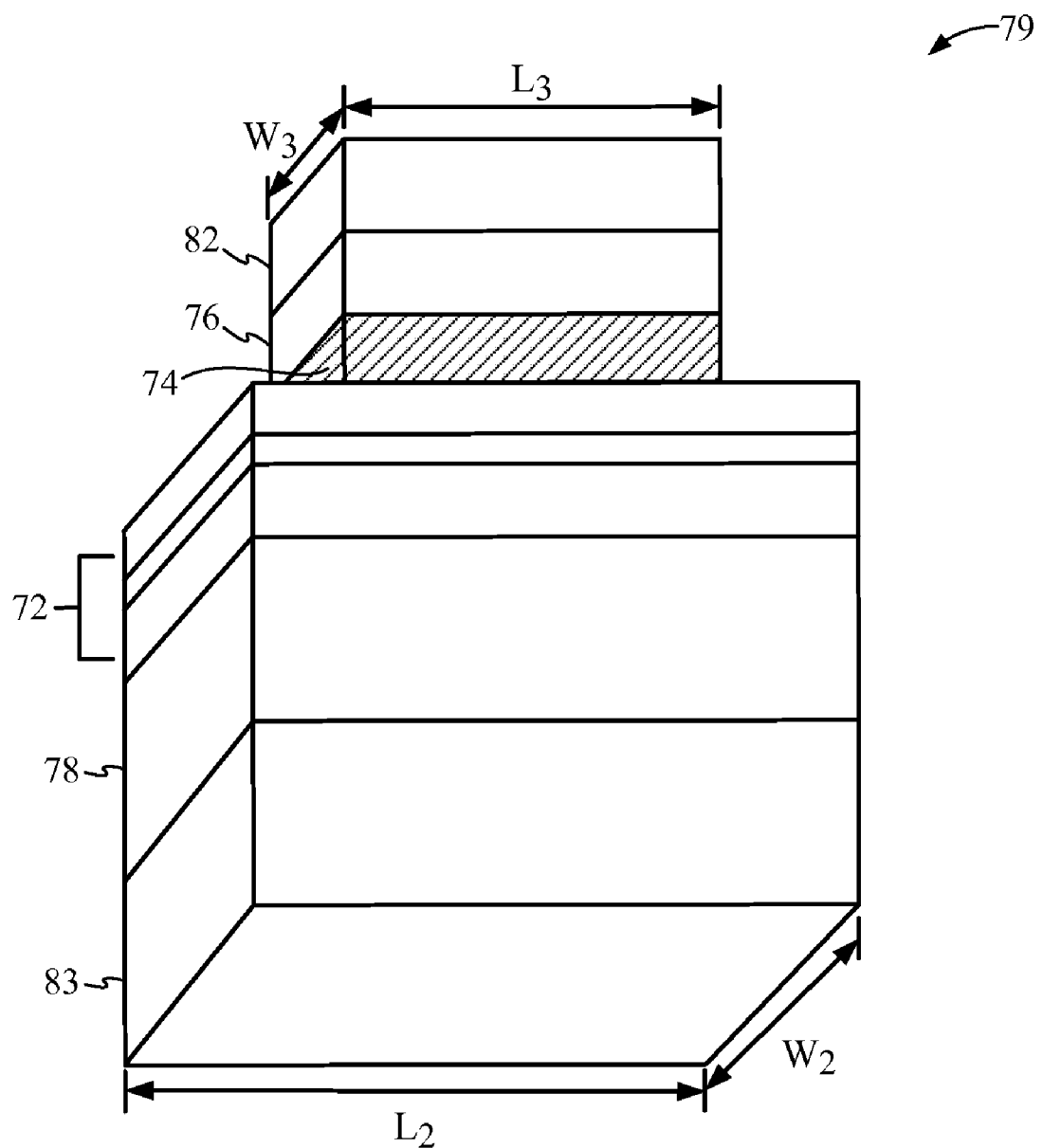
FIG. 6b is a diagram of an exemplary cross-section of a portion of a MTJ having a pinned layer disposed below and having a length greater than the length of a free layer, and that may be employed in the MRAM bitcell of FIG. 4b.

A person of ordinary skill in the art will understand that the pinning of SAF pinned layer 58 in FIG. 4b may also be enhanced by similar methods discussed above. FIG. 6b illustrates an embodiment of MTJ structure 79 where the pinned layer 72 has a surface area greater than the surface area of the free layer 76. By providing the pinned layer 72 having a pinned layer surface area greater than a free layer surface area of the free layer 76, this allows enhanced pinning of the pinned SAF layer 72 for the reasons discussed above. A pinned layer surface area being greater than a free layer surface area is not limited to any particular geometry or physical design.

Figure 7:
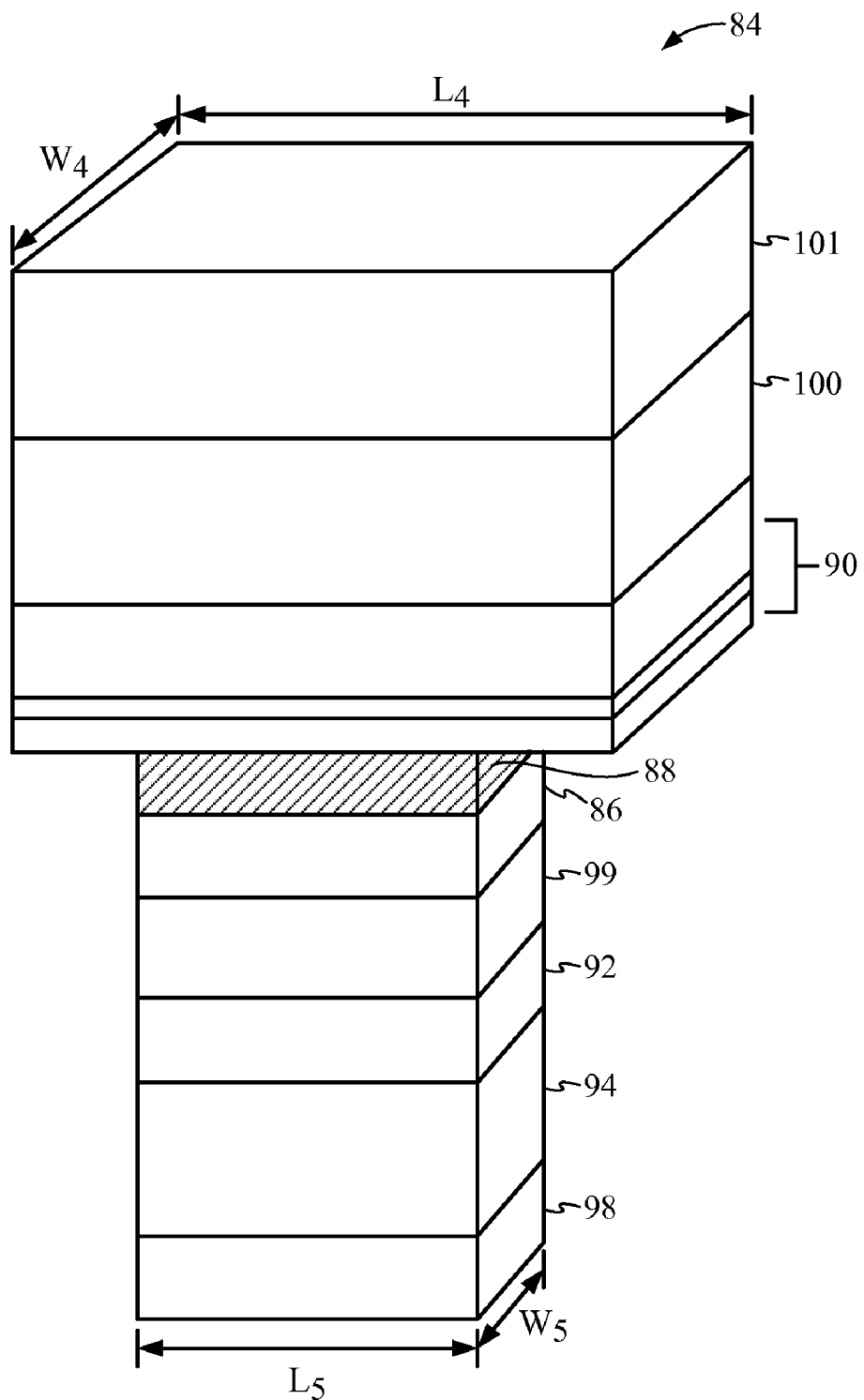
FIG. 7 is a diagram of an exemplary cross-section of a portion of a dual-spin structure MTJ having a pinned layer disposed above and having a length greater than the length of a free layer, and that may be employed in the MRAM bitcell of FIG. 4a or FIG. 4b.
Figure 8:
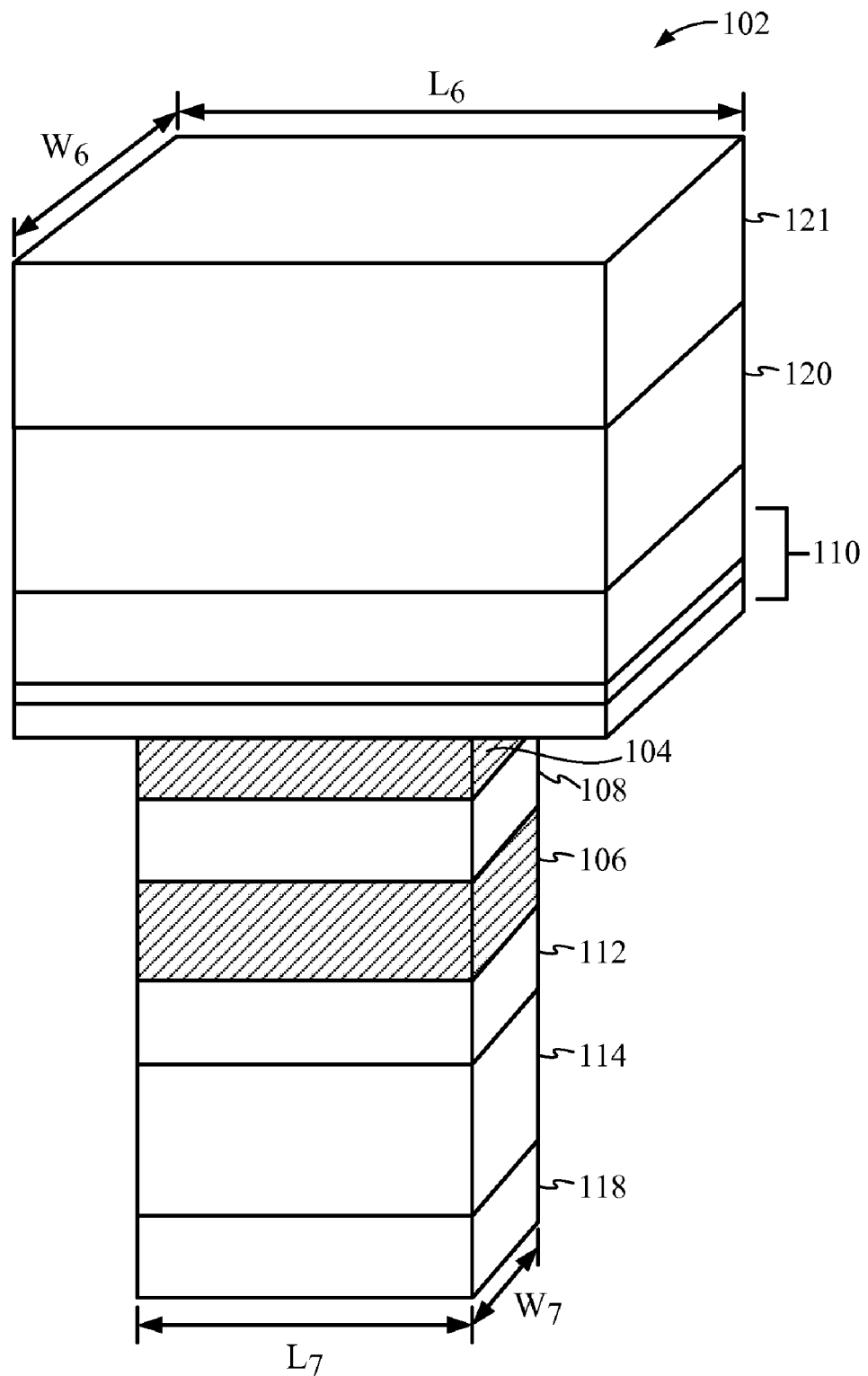
FIG. 8 is a diagram of another exemplary cross-section of a portion of a dual-spin structure MTJ disposed above and having a length greater than the length of a free layer, and that may be employed in the MRAM bitcell of FIG. 4a or FIG. 4b.

FIGS. 7 and 8 illustrate alternative embodiments of MTJ structures that also may be employed, including in the MRAM bitcell 40 of FIG. 4a and the MRAM bitcell 49 of FIG. 4b. These MTJ structures employ dual-spin structures whereby two pinned layers are employed. Dual-spin MTJ structures provide a free layer whose switching is affected by two spin torques from two pinned layers. The previous examples of MTJs provided above were single-spin structures whereby only one pinned layer is employed. Dual-spin MTJ structures typically allow switching of a free layer magnetization with less write current than typically required of single-spin MTJ structures. In each of the dual-spin MTJ structures illustrated in FIGS. 7 and 8, each contain at least one pinned layer having a pinned layer surface area greater than the surface area of the free layer to provide a surface area for an AFM layer to securely pin the pinned layer. All of the possibilities provided for the single-spin MTJ 70 of FIGS. 6a and 6b and described above are also possible for the dual-spin MTJ structures of FIGS. 7 and 8. However for the purposes of this discussion, the configurations of FIGS. 4a and 6a will be used as example configurations for the embodiments described in FIGS. 7 and 8. A person of ordinary skill in the art will understand that FIGS. 4b and 6b may also be used as example configurations for the embodiments described in FIGS. 7 and 8.

Turning to FIG. 7, a first dual-spin MTJ 84 is illustrated. A free layer 86 and tunnel barrier 88 are surrounded by top and bottom pinned layers 90, 92. The bottom pinned layer 92 is placed or deposited on an AFM layer 94, PtMn as an example. The AFM layer 94 is placed or deposited on top of a second electrode 98. The free layer 86 is placed or deposited on a non-magnetic spacing layer 99, Ru as an example, which is placed or deposited on top of the bottom pinned layer 92. The bottom pinned layer 92 can be provided in the form of an SAF pinned layer structure. The top pinned layer 90 is provided in the form of an SAF pinned layer structure. An AFM layer 100 is placed or deposited on top of the SAF pinned layer structure 90 to pin the magnetization of the SAF pinned layer structure 90 in a given direction. The pinned layer length of the SAF pinned layer structure 90 (labeled "$L_4$") is greater than the free layer length of the free layer 86 (labeled "$L_5$"). This provides for the surface area of the SAF pinned layer structure 90 to be greater than the surface area of the free layer 86 in this embodiment. The pinned layer length of SAF pinned layer structure 90 can be of any dimensions desired and can have a surface area greater than the surface area of the free layer 86. One exemplary embodiment provides the pinned layer length of the SAF pinned layer structure 90 to be between approximately one hundred ten percent (110%) and three hundred percent (300%) greater than the free layer length. The top pinned layer 90 can also be provided in the form of a single pinned layer structure.

Again, variations can be provided. For example, the lengths and/or widths of any of the second electrode 98, the AFM layer 94, the bottom pinned layer 92, the non-magnetic spacing layer 99, and/or tunnel barrier 88 may be placed or deposited in the MTJ 84 at the same or substantially length and/or width as the free layer length, or they may be placed or deposited in the MTJ 84 at different lengths and/or widths. Also as an example, the length of a first electrode 101 placed on top of the AFM layer 100 may of the same, longer, or shorter length and/or width than the length and/or width of the AFM layer 100, the SAF pinned layer structure 90, or the free layer 86. For example, the pinned layer width of the SAF pinned layer structure 90, shown as "$W_4$" in FIG. 7, may be greater than the free layer width of the free layer 86, shown as "$W_5$" in FIG. 7. As an example, pinned layer width $W_4$ may be 120 nm, and free layer width $W_5$ may be 100 nm. Alternatively, the pinned layer width and the free layer width may be the same or substantially the same width. The pinned layer width of the SAF pinned layer structure 90 may also be less than the free layer width, although most designs would either provide the same or substantially the same pinned layer width for the SAF pinned layer structure 90 and the free layer 86, or the SAF pinned layer structure 90 at a pinned layer width greater than the free layer width due to constraints of placement or depositing techniques. All that is required is a pinned layer having a pinned layer surface area greater than a free layer surface area of the free layer.

FIG. 8 illustrates an alternative dual-spin MTJ 102. In this MTJ 102, first and second tunnel barriers 104, 106 are provided. A free layer 108 is immediately surrounded by the first and second tunnel barriers 104, 106. The first and second tunnel barriers 104, 106 are immediately surrounded by top and bottom pinned layers 110, 112, respectively. The bottom pinned layer 112 is placed or deposited on an AFM layer 114, similar to the MTJ design in FIG. 7. The AFM layer 114 is placed or deposited on top of a second electrode 118. The top and the bottom pinned layer 110, 112 can be provided in the form of either an SAF pinned layer structure or a single pinned layer structure. An AFM layer 120 is placed or deposited on top of the SAF pinned layer structure 110 to pin the magnetization of the SAF pinned layer structure 110 in a given direction. The pinned layer length of the SAF pinned layer structure 110 (labeled "$L_6$") is greater in length than the length of the free layer 108 (labeled "$L_7$"). This provides for the surface area of the SAF pinned layer structure 110 to be greater than the surface area of the free layer 108 in this embodiment. The pinned layer length of SAF pinned layer structure 110 can be of any length desired and can be greater than the free layer length without limit. However, one exemplary embodiment provides the pinned layer length of the SAF pinned layer structure 110 to be between approximately one hundred ten percent (110%) and three hundred percent (300%) greater than the free layer length.

Again, variations can be provided. For example, the lengths and/or widths, of any of the second electrode 118, the AFM layer 114, the bottom pinned layer 112, and the first and second tunnel barriers 104, 106 may be placed or deposited in the MTJ 102 at the same or substantially the same length and/or width as the free layer, or they may be placed or deposited in the MTJ 102 at different lengths and/or widths. Also as an example, the length of a first electrode 121 placed on top of the AFM layer 120 may be of the same, longer, or shorter length and/or width than the length and/or width of the AFM layer 120, the SAF pinned layer structure 110, or the free layer 108. Further, the pinned layer width of the SAF pinned layer structure 110, shown as "$W_6$" in FIG. 8, may be greater than the free layer width of the free layer 108, shown as "$W_7$" in FIG. 8. As an example, width $W_6$ may be 120 nm, and width $W_7$ may be 100 nm. Alternatively, their widths may be the same or substantially the same. The width of the SAF pinned layer structure 110 may also be less than the width of the free layer 108, although most designs would either provide the same width between the SAF pinned layer structure 110 and the free layer 108, or the SAF pinned layer structure 110 having a greater width than the width of the free layer 108 due to constraints of depositing techniques. All that is required is a pinned layer having a pinned layer surface area greater than a free layer surface area of the free layer.

Various modifications may be made to the above MTJ structures. The MTJ structure may be provided in any orientation or axis, including vertical (as illustrated), horizontal, or angled. Further, the cross-section of the MTJ layers may be provided of any shape desired, including rectangular, other polygon, or elliptical. The MTJ layers, including the pinned layer and the free layer may be of different shapes or structures having either the same or different dimension(s). Depending on the composition of the various layers and etches used, the order in which certain layers are placed or deposited can be varied. For MTJ structures having length and/or width dimensions, the length and/or width dimensions of the provided layers in MTJ structure may be of any lengths and/or widths desired and in any ratio of lengths and/or widths to other layers so long as the pinned layer has a pinned layer surface area greater than a free layer surface area of the free layer. It will also be recognized that the order of layers and the materials forming those layers in the above embodiments are merely exemplary. In addition, although in the illustrated embodiment the support structures are generally depicted as round or having rounded corners, in alternate embodiments the support structures may have different shapes. Moreover, in some embodiments, other layers (not shown) may be placed or deposited and processed to form portions of a MTJ device or to form other structures on the substrate. In other embodiments, these layers may be formed using alternative deposition, patterning, and etching materials and processes, may be placed or deposited in a different order, or composed of different materials, as would be known to one of skill in the art.

Further, the MTJ may be provided in any electronic device for storing data. The MTJ device may be provided in MRAM bitcell and/or MRAM bitcell circuit to store data, where such data can be stored, read from, and/or written into the MTJ. The MTJ according to embodiments disclosed herein may be included or integrated in a semiconductor die and/or in any other device, including an electronic device. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of ordinary skill in the art. Those of ordinary skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic tunnel junction (MTJ), comprising:
a first electrode and a second electrode;
a tunnel barrier between the first electrode and the second electrode;
a free layer between the second electrode and the tunnel barrier; and
a pinned layer between the first electrode and the tunnel barrier;
wherein the pinned layer has a pinned layer surface area at least ten percent greater than a free layer surface area of the free layer.

2. The MTJ of claim 1, further comprising an anti-ferromagnetic material (AFM) layer of an AFM layer length between the first electrode and the pinned layer.

3. The MTJ of claim 2, wherein surface area of the AFM layer is the same or greater than the pinned layer surface area.

4. The MTJ of claim 1, wherein the pinned layer is comprised of a synthetic anti-ferromagnetic (SAF) pinned layer structure.

5. The MTJ of claim 4, wherein the SAF pinned layer structure comprises at least two ferromagnetic layers separated by a coupling layer.

6. The MTJ of claim 1, wherein at least one of the pinned layer and the free layer is formed from a ferromagnetic material.

7. The MTJ of claim 1, wherein the pinned layer surface area and the free layer surface area are comprised from dimensions from the group consisting of a length, a width, a diameter, a radius, and a circumference.

8. The MTJ of claim 1, wherein the pinned layer has a pinned layer length and the free layer has a free layer length, wherein the pinned layer length is different than the free layer length.

9. The MTJ of claim 1, wherein the free layer has a free layer width and the pinned layer has a pinned layer width, wherein the pinned layer width is different than the free layer width.

10. The MTJ of claim 1, further comprising a second pinned layer between the second electrode and the free layer.

11. The MTJ of claim 10, further comprising a non-magnetic spacing layer or substantially non-magnetic spacing layer between the free layer and the second pinned layer.

12. The MTJ of claim 10, further comprising an AFM layer between the second electrode and the second pinned layer.

13. The MTJ of claim 1, further comprising a second tunnel barrier between the free layer and the second electrode.

14. The MTJ of claim 13, further comprising a second pinned layer between the second tunnel barrier and the second electrode.

15. The MTJ of claim 1 integrated in at least one semiconductor die.

16. The MTJ of claim 1, further comprising a device, selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the MTJ is integrated.

17. The MTJ of claim 1, wherein the pinned layer surface area is comprised of a surface area of a side of the pinned layer proximate the tunnel barrier, and the free layer surface area is comprised of a surface area of a side of the free layer proximate to the tunnel barrier.

18. A magnetic random access memory (MRAM) bitcell, comprising:
an access transistor having a gate, a source, and a drain;
a magnetic tunnel junction (MTJ), comprising:
a first electrode and a second electrode;
a tunnel barrier between the first electrode and the second electrode;
a free layer between the second electrode and the tunnel barrier; and
a pinned layer between the first electrode and the tunnel barrier;
wherein the pinned layer has a pinned layer surface area at least ten percent greater than a free layer surface area of the free layer; and
wherein a write line is coupled to the gate, the second electrode is coupled to the drain, and a bit line is coupled to the first electrode.

19. The MRAM bitcell of claim 18, further comprising an anti-ferromagnetic material (AFM) layer of an AFM layer length between the first electrode and the pinned layer.

20. The MRAM bitcell of claim 19, wherein at least one dimension of the AFM layer is the same or greater than at least one dimension of the pinned layer.

21. The MRAM bitcell of claim 18, comprising a plurality of the MRAM bitcells to form an MRAM array.

22. The MRAM bitcell of claim 18 integrated in at least one semiconductor die.

23. The MRAM bitcell of claim 18, further comprising a device, selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the MRAM bitcell is integrated.

24. The MRAM bitcell of claim 18, wherein the pinned layer surface area is comprised of a surface area of a side of the pinned layer proximate the tunnel barrier, and the free layer surface area is comprised of a surface area of a side of the free layer proximate to the tunnel barrier.

25. A magnetic tunnel junction (MTJ), comprising:
a first electrode means and a second electrode means;
a tunnel barrier means disposed between the first electrode and the second electrode;
a free layer means disposed between the second electrode and the tunnel barrier;
a pinned layer means disposed between the first electrode and the tunnel barrier;
wherein the pinned layer has a pinned layer surface area at least ten percent greater than a free layer surface area of the free layer.

* * * * *